United States Patent [19]

Hong

[11] Patent Number: 5,429,960
[45] Date of Patent: Jul. 4, 1995

[54] METHOD OF MAKING FLASH EEPROM MEMORY

[75] Inventor: Gary Hong, Hsinchu, Taiwan

[73] Assignee: United Microelectronics Corporation, Hsinchu, Taiwan

[21] Appl. No.: 345,129

[22] Filed: Nov. 28, 1994

[51] Int. Cl.6 ................ H01L 21/266; H01L 21/8247
[52] U.S. Cl. ........................................ 437/35; 437/43; 437/984
[58] Field of Search ...................... 437/35, 43, 984, 48, 437/52; 257/316

[56] References Cited

U.S. PATENT DOCUMENTS

| 5,310,693 | 5/1994 | Hsue ........................................ 437/43 |
| 5,352,618 | 10/1994 | Larsen et al. ........................... 437/43 |

FOREIGN PATENT DOCUMENTS

| 4280422A | 10/1992 | Japan ........................................ 437/35 |

*Primary Examiner*—Olik Chaudhuri
*Assistant Examiner*—Richard A. Booth

*Attorney, Agent, or Firm*—George O. Saile

[57] ABSTRACT

This invention provides a flash EEPROM, or electrically programmable and erasable read only memory, structure and a method for forming the flash EEPROM structure. The invention uses a large angle ion implant beam without wafer rotation to form the source and drain regions of the memory cell. A low doped region is formed at the edge of the drain region. The tunnel dielectric is formed directly above the low doped region. The width of the low doped region is controlled by the angle of the large angle ion implant beam and can be very accurately controlled. The tunnel dielectric is formed independently of the gate dielectric and the thickness of each can be optimized. The tunnel dielectric area can be made very small which improves reliability and reduces the voltage necessary to program and erase the memory cell. A temporary nitride floating gate electrode, which is later replaced by a polysilicon floating gate electrode, provides flexibility in the location of the floating gate electrode.

13 Claims, 6 Drawing Sheets

METHOD OF MAKING FLASH EEPROM MEMORY

RELATED PATENT APPLICATION

Ser. No. 08/304,119, filed Sep. 12, 1994, entitled "Method of Making Flash Memory Cell With Self-Aligned Tunnel Dielectric Area," assigned to the same assignee.

BACKGROUND OF THE INVENTION (1) Field of the Invention

This invention relates to a flash memory EEPROM, electrically erasable and programmable read only memory, structure and process which uses a large angle ion implant beam to form the source and drain regions in the cell. A low doped region is formed between the edge of the source and the edge of the first gate electrode. The tunnel dielectric is grown over this low doped region and is self-aligned with it. This method provides a self-aligned very small tunnel dielectric area. The process uses a temporary nitride floating gate electrode which allows freedom to locate the floating gate electrode where desired. This invention provides a normal gate EEPROM and a split-gate EEPROM.

(2) Description of Related Art

Conventional flash EEPROM memory structures have the disadvantage of a large tunnel dielectric area which requires large voltages for programming and erase operations of the memory cell. In addition larger tunnel dielectric areas introduce more defects and lower device yield. Often the tunnel dielectric is the same dielectric as the gate dielectric which leads to a compromise between gate dielectric thickness and tunnel oxide thickness.

This invention has the advantage of a tunnel dielectric which is independent of the gate dielectric and the thickness of each can be optimized. In this invention the tunnel dielectric is self-aligned to the source and gate and has a width that can be accurately controlled. The location of the floating gate electrode can be varied to provide a normal gate flash EEPROM or a split-gate flash EEPROM.

SUMMARY OF THE INVENTION

It is a principle object of this invention to provide a method for forming a flash EEPROM, or electrically erasable and programmable read only memory, having a very small tunnel oxide area there by making possible programming and erase operations using a low voltage.

It is a further object of this invention to provide a flash EEPROM, or electrically erasable and programmable read only memory, device having a very small and tunnel oxide area thereby making possible programming and erase operations using a low voltage.

It is a further object of this invention to provide a flash EEPROM, or electrically erasable and programmable read only memory, device with a split-gate having a very small tunnel oxide area thereby making possible programming and erase operations using a low voltage. The split-gate device forms an isolation transistor and a floating gate transistor in the same device structure.

These objectives are achieved by making use of a thin tunnel oxide region and self-aligned thick oxide regions which are grown independently from the gate oxide region. The thin tunnel oxide region is grown over a light doped $N^-$ region and grows at a slower rate than the self-aligned thick oxide region which is grown over an $N^+$ region. The gate oxide thickness and the thin tunnel oxide thickness can be independently controlled and can each be optimized. The width of the $N^-$ light doped region is controlled by the angle of a large angle ion implant beam used to form the source and drain regions. The tunnel oxide region and the self-aligned thick oxide region are grown simultaneously and are self aligned to the light doped region and the drain region. This method provides precise control of the tunnel oxide region which is kept very small.

This invention uses a temporary nitride floating gate electrode for the formation of the source, drain and light doped regions. The temporary floating gate electrode is then removed and later a polysilicon floating gate electrode is formed. This method provides freedom in the location of the floating gate electrode to form either a normal gate flash EEPROM or a split-gate flash EEPROM. A polysilicon control gate electrode is formed over the floating gate electrode and insulated from the floating gate electrode. The control gate electrode is formed at right angles to the floating gate electrode, the source region, the drain region, and the light doped region and is also the word line.

When a suitable potential is applied to the control gate electrode or word line while grounding the drain electrons tunnel through the small area of the tunnel oxide and are injected into the floating gate electrode from the drain thereby programming the memory cell. Conversely, when a suitable potential is applied to the drain while grounding the control gate electrode or word line electrons tunnel through the small area of the tunnel oxide and are removed from the floating gate electrode into the drain thereby erasing the memory cell. The smaller the area of the tunnel oxide region the lower is the voltage required for the programming and erase operations.

DESCRIPTION OF THE PREFERRED EMBODIMENTS

Figure 1:
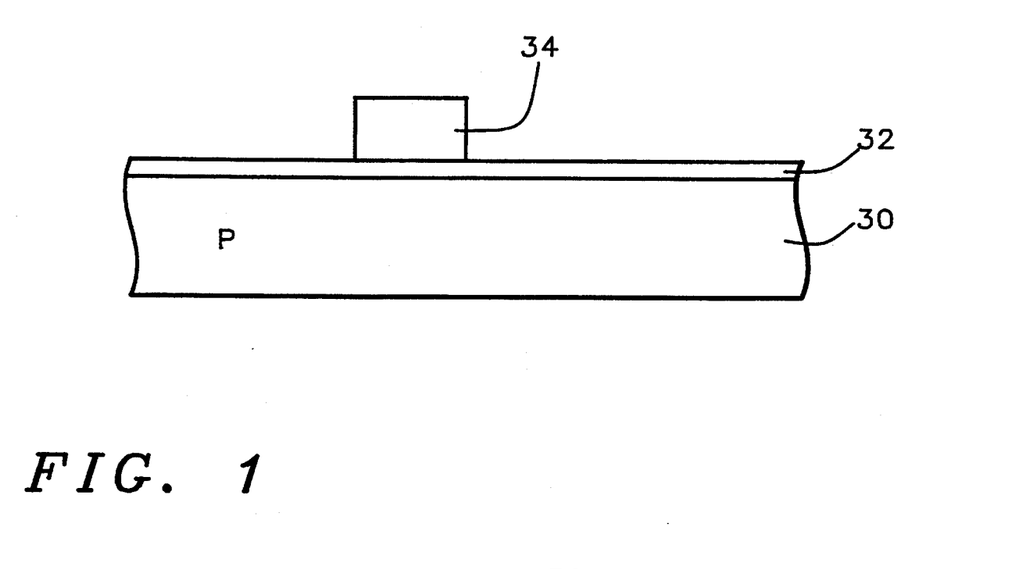
FIG. 1 is a cross section view of the silicon substrate after the gate oxide layer and the temporary nitride floating gate electrode have been formed.

Refer now to FIG. 1 through FIG. 7, there is shown an embodiment of a method of forming a flash EEPROM memory. FIG. 1 shows a cross section of a P type silicon substrate 30 with a gate oxide layer 32, such as $SiO_2$ with a thickness of between about 150 Angstroms and 500 Angstroms, formed on the surface of the silicon substrate using conventional means. A nitride strip 34 having a width of between about 0.3 and 1.5 microns, a thickness of between about 500 and 5000 Angstroms, and a length sufficient to cover a number of adjacent memory cells is formed on the gate oxide layer using conventional means.

Figure 2:
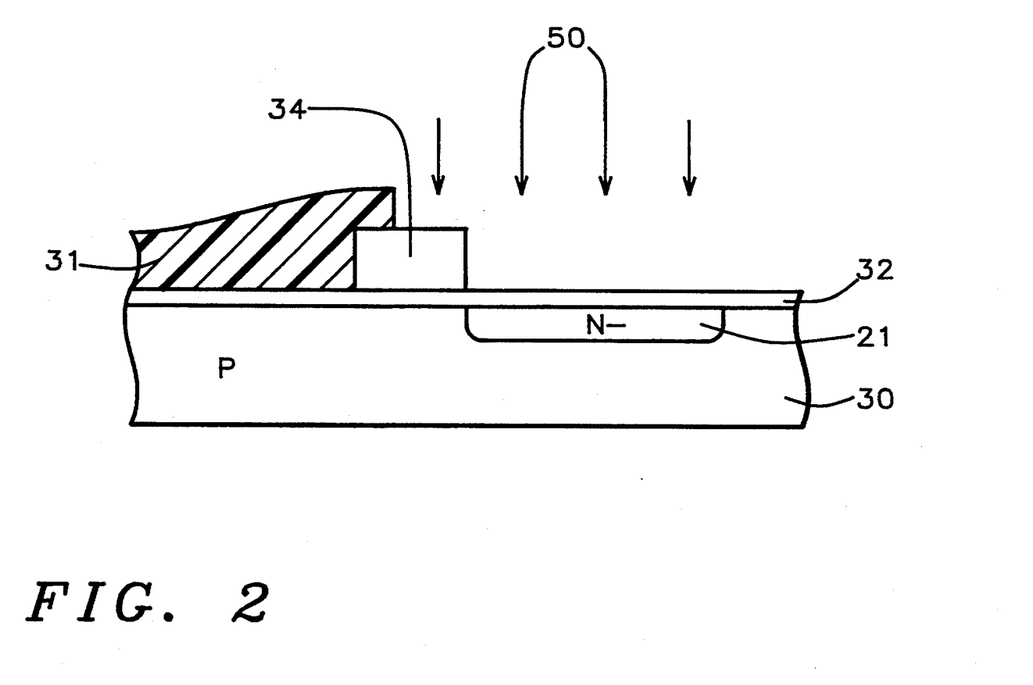
FIG. 2 is a cross section view of the silicon substrate with the gate oxide layer and temporary floating gate electrode showing the normally directed ion implant beam.
Figure 3:
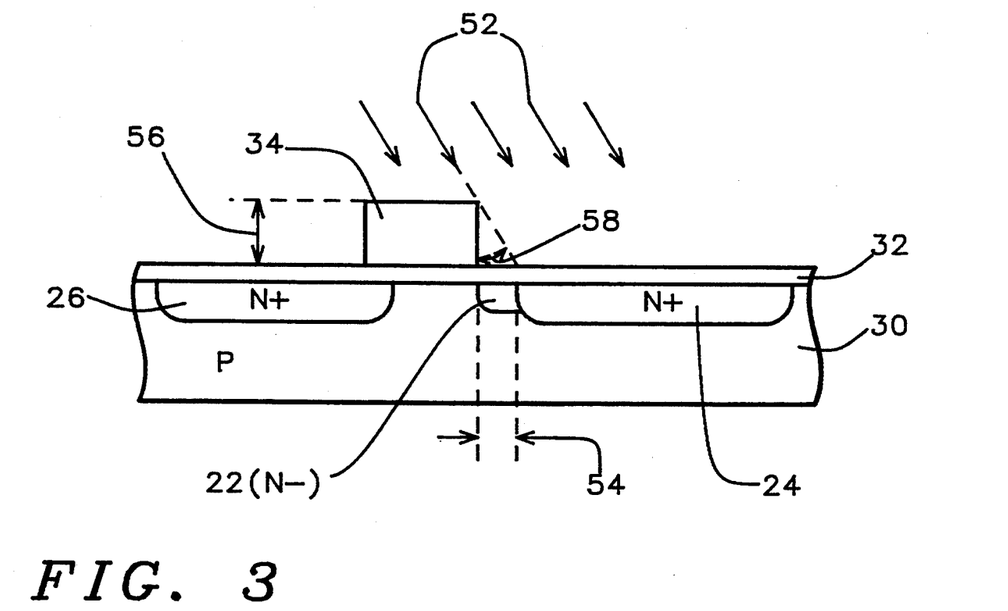
FIG. 3 is a cross section view of the silicon substrate with the gate oxide layer and temporary floating gate electrode showing the large angle ion implant beam, the source region, the drain region and the light doped region.

Next, as shown in FIG. 2, a patterned layer of photoresist 31 is formed on the gate oxide layer 32 covering a part of the nitride strip 34. Then an $N^-$ light doped area 21 is formed in the silicon substrate 30 adjacent to one edge of the nitride strip by means of ion implantation. The ion implantation uses a normally directed ion beam 50 of arsenic or phosphorous of between about $1 \times 10^{13}$ and $1 \times 10^{14}$ ions/cm$^2$ at between about 30 and 100 keV. The light doped area is formed using one edge of the nitride strip 34 and the patterned layer of photoresist 31 as a mask. Next, as shown in FIG. 3 $N^+$ source 26 and drain 24 regions are formed on either side of the nitride strip 34 using a large angle ion implant beam 52 and the nitride strip 34 as a mask. The large angle ion implant beam 52 uses an arsenic ion beam with between about $1 \times 10^{15}$ and $5 \times 10^{15}$ ions/cm$^2$ at between about 30 and 100 keV. The large angle ion implant beam 52 makes an angle 58 of between about 10° and 60° with a line normal to the surface of the silicon substrate 30. The large angle ion implant step is carried out without rotation of the silicon substrate. The large angle ion implant beam converts much of the $N^-$ light doped area to the $N^+$ drain region 24 leaving a small width 54 of the light doped area 21 $N^-$ to form the light doped region 22. The width of the light doped region 54 is determined by the tangent of the angle 58 between the large angle ion implant beam 52 and a line normal to the silicon substrate multiplied by the height 56 of the nitride strip and is between about 500 and 5000 Angstroms.

Figure 4:
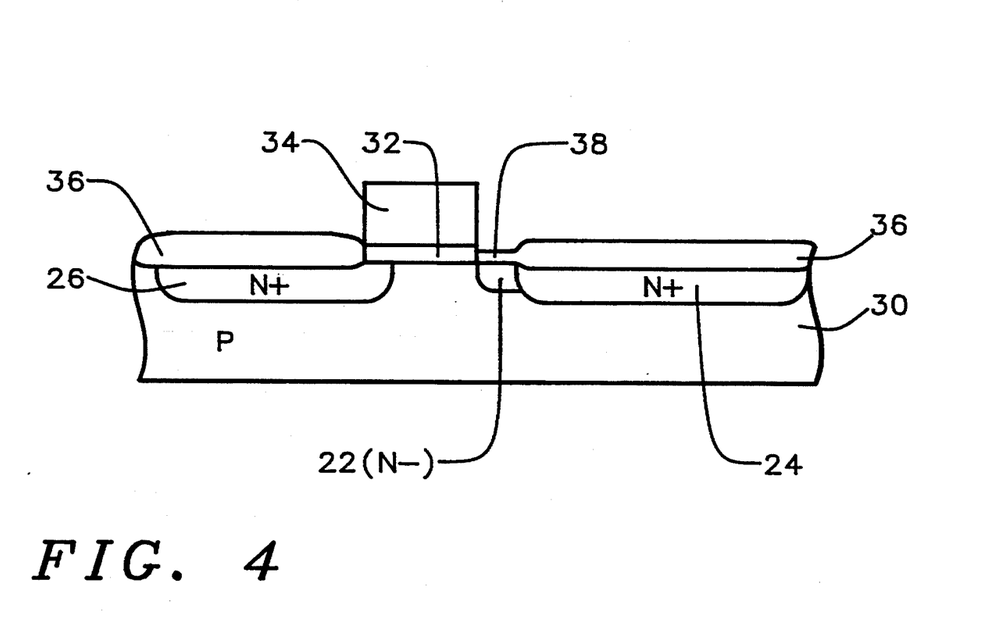
FIG. 4 is a cross section of the silicon substrate after the gate oxide has been etched to the shape of the temporary nitride floating gate electrode and the tunnel oxide region and self-aligned thick oxide regions have been formed.

Next, as shown in FIG. 4, the gate oxide not covered by the nitride strip is removed using conventional etching. A tunnel oxide area 38 and self-aligned thick oxide areas 36 are then formed on the silicon substrate by means of a thermally grown oxide using a temperature of between about 800° C. and 1000° C. in an $O_2$ rich environment. The tunnel oxide 38 and the self-aligned thick oxide 36 are grown at the same time but the tunnel oxide 38 grown on $N^-$ type silicon grows slower than the self-aligned thick oxide 36 which is grown on $N^+$ type silicon. The tunnel oxide 38 is grown to a thickness of between about 60 and 100 Angstroms and the corresponding self-aligned thick oxide 36 thickness is between about 150 and 500 Angstroms.

Figure 5:
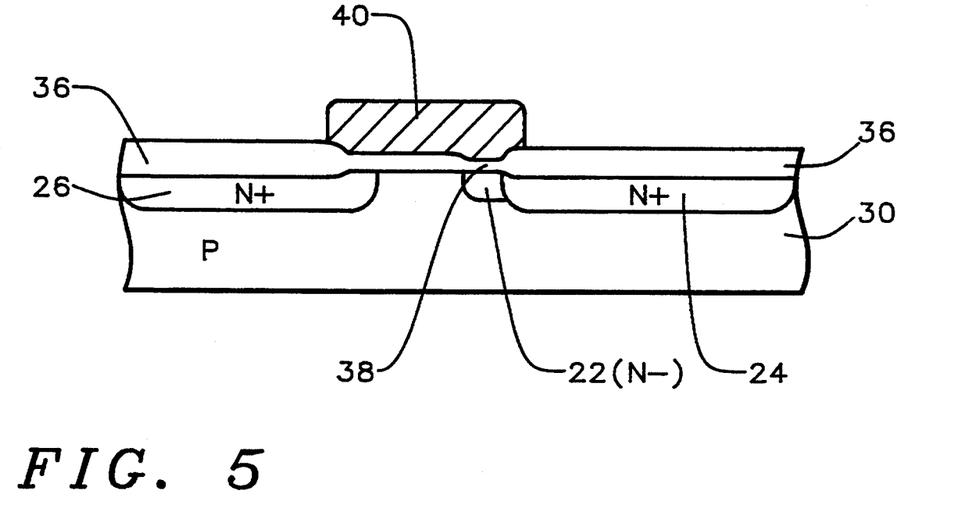
FIG. 5 is a cross section of the normal gate EEPROM after the polysilicon floating gate electrode has been formed.

Next, as shown in FIG. 5, the nitride strip is removed by etching with phosphoric acid leaving a gate oxide region 32, a tunnel oxide region 38, and self-aligned thick oxide regions 36 covering the surface of the silicon substrate. Next a polysilicon floating gate electrode 40 with a thickness of between about 500 and 5000 Angstroms is formed using conventional means and is patterned such that the floating gate electrode 40 covers the gate oxide region 32 and the tunnel oxide region 38 extending onto the edges of the self-aligned thick oxide regions 36 thereby forming the floating gate electrode for the normal gate flash EEPROM. The floating gate electrode is patterned such that the floating gate electrode of one flash EEPROM cell is separated from the floating gate electrode of other flash EEPROM cells.

Figure 6A:
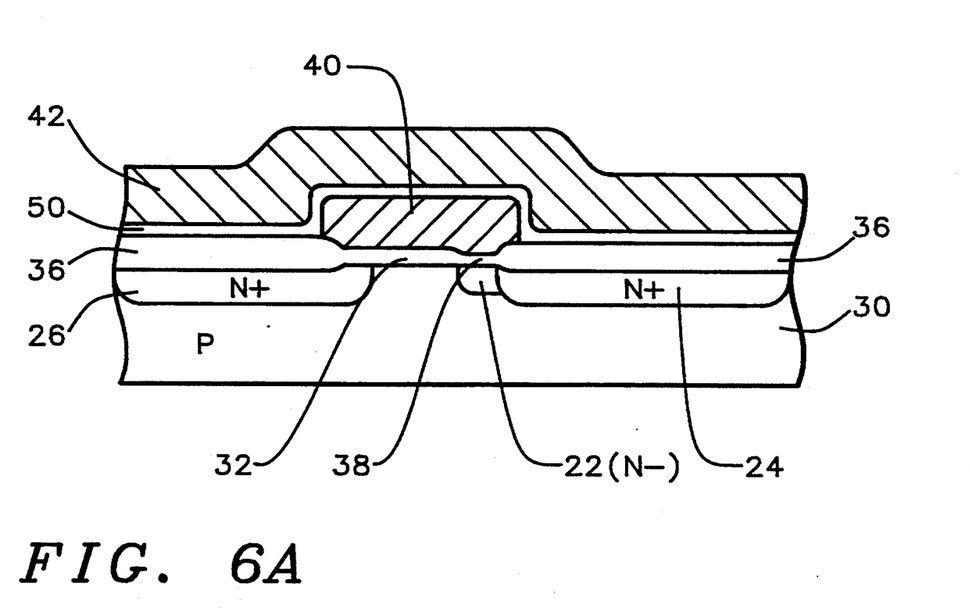
FIG. 6A is a cross section of the normal gate EEPROM after the oxide nitric oxide layer and polysilicon control gate electrode have been formed.
Figure 6B:
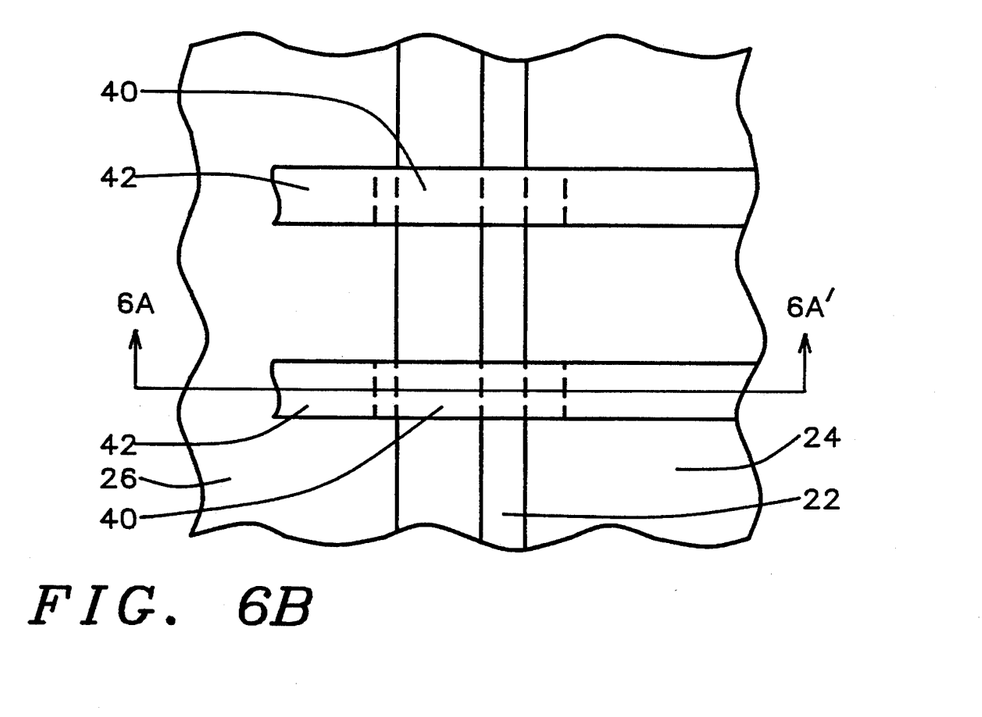
FIG. 6B is a top view of the normal gate EEPROM after the polysilicon control gate electrode has been formed.

Next, as shown in FIG. 6A, a blanket layer of oxide/nitride/oxide 50 with an effective thickness of between about 100 and 300 Angstroms is formed over the floating gate electrodes 40 and thick oxide layer 36. A polysilicon control gate electrode 42 is then deposited and patterned using conventional means. FIG. 6B shows an example of the top view of the flash EEPROM memory at this stage of fabrication. As shown in FIG. 6B, the control gate electrodes 42 are at right angles to the source region 26, the drain region 24, and the light doped region 22.

Figure 7:
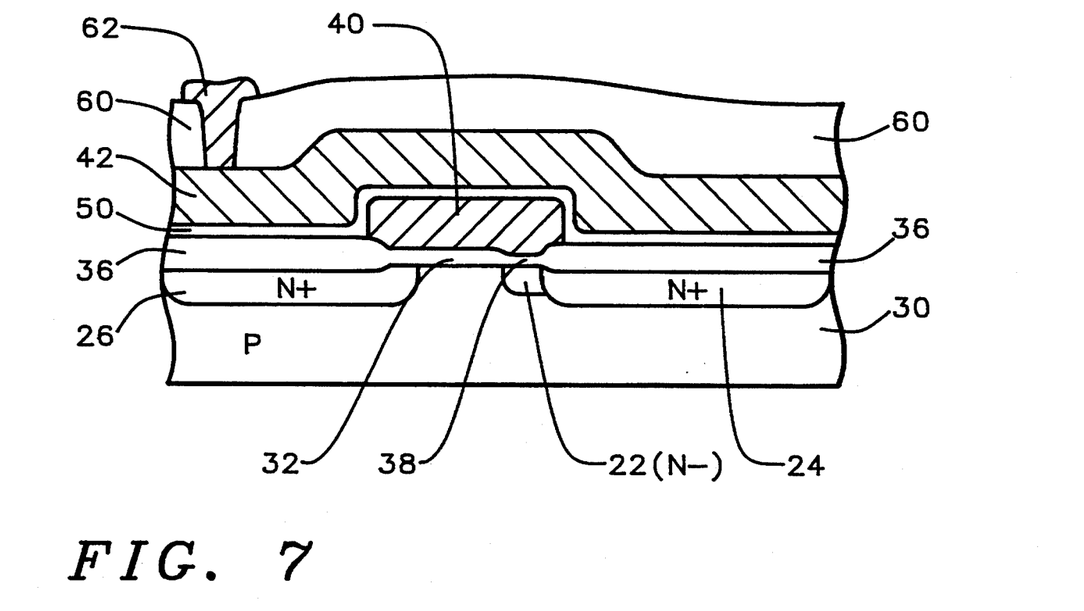
FIG. 7 is a cross section of the normal gate EEPROM after the insulating dielectric layer and metal contact to the floating gate electrode have been formed.

Next, as shown in FIG. 7, an insulating dielectric layer 60, such as borophosphosilicate glass, with contact openings is formed on the flash EEPROM memory using conventional means. Metal contacts 62 to the control gate electrodes 42 are formed in the contact openings using conventional means. Next a patterned metal conducting layer, not shown, is formed on the insulating dielectric layer 60 and the flash EEPROM memory is covered by a passivating dielectric layer, not shown, using conventional means. Examples of the conventional means referred to in this embodiment can be found is the book "VLSI PROCESS TECHNOLOGY" Second Edition, by S. M. Sze, published by McGraw-Hill Book Co., New York, N.Y., 1988, pages 221-228, 233-269, and 375-418.

Refer now to FIG. 1 through FIG. 4 and FIG. 8 through FIG. 10, there is shown another embodiment of a method of forming a flash EEPROM memory. As shown in FIG. 1 through FIG. 4, the method of this embodiment is the same as the previous embodiment through the step of forming the a tunnel oxide area 38 and self-aligned thick oxide areas 36 on the silicon substrate by means of a thermally grown oxide using a temperature of between about 800° C. and 1000° C. in an $O_2$ rich environment. As in the previous embodiment the tunnel oxide 38 and the self-aligned thick oxide 36 are grown at the same time but the tunnel oxide 38 grown on $N^-$ type silicon grows slower than the self-aligned thick oxide 36 which is grown on $N^+$ type silicon. The tunnel oxide 38 is grown to a thickness of between about 60 and 100 Angstroms and the corresponding self-aligned thick oxide 36 thickness is between about 150 and 500 Angstroms.

Figure 8:
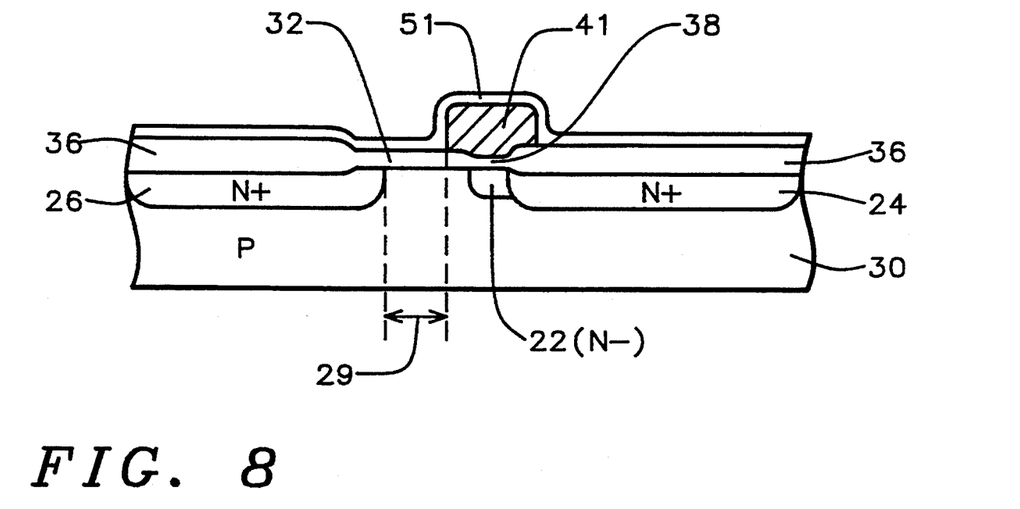
FIG. 8 is a cross section of the split-gate EEPROM after the polysilicon floating gate electrode has been formed.

Next, as shown in FIG. 8, the nitride strip is removed by etching with phosphoric acid leaving a gate oxide region 32, a tunnel oxide region 38, and self-aligned thick oxide regions 36 covering the surface of the silicon substrate. Next a polysilicon floating gate electrode 41 with a thickness of between about 500 and 2000 Angstroms is formed using conventional means and is patterned such that the floating gate electrode 41 covers tunnel oxide region 38 and a part of the gate oxide region 32 extending onto the edge of the self-aligned thick oxide region 36 covering the drain region 24 thereby forming the floating gate electrode for the split-gate flash EEPROM. The floating gate electrode is patterned such that the floating gate electrode of one flash EEPROM cell is separated from the floating gate electrode of other flash EEPROM cells. The part of the gate oxide region 32 covered by the floating gate electrode 41 extends from the tunnel oxide region 38 toward the source region 26 leaving a gap 29 between the edge of the floating gate electrode 41 and the edge of the source region 26. Next a blanket layer of oxide/nitride/oxide 51 with a thickness of between about 100 and 300 Angstroms is formed on the floating gate electrodes and oxide regions not covered by the floating gate electrodes.

Figure 9A:
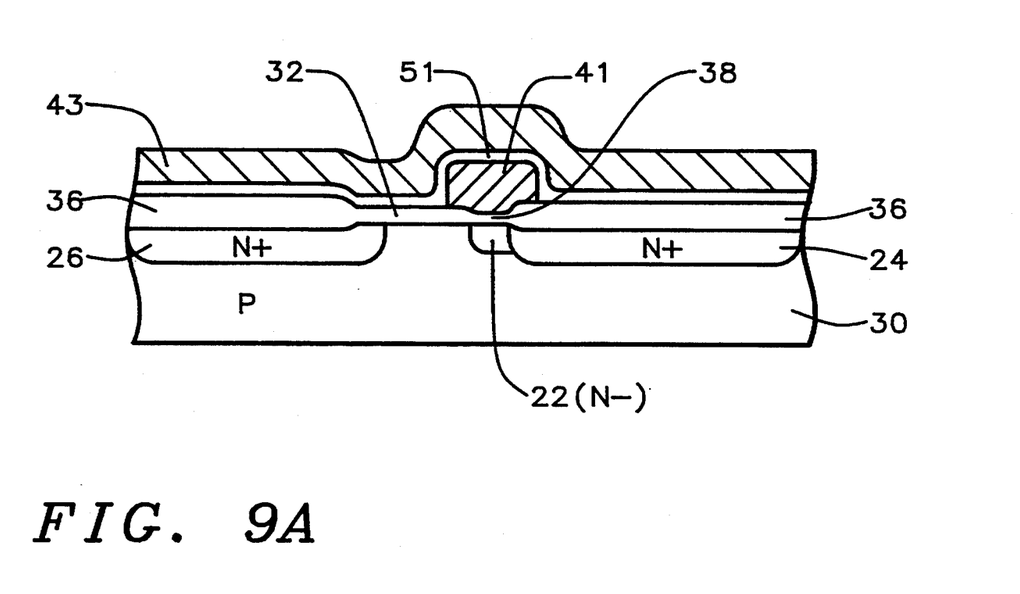
FIG. 9A is a cross section of the split-gate EEPROM after the oxide nitric oxide layer and polysilicon control gate electrode have been formed.
Figure 9B:
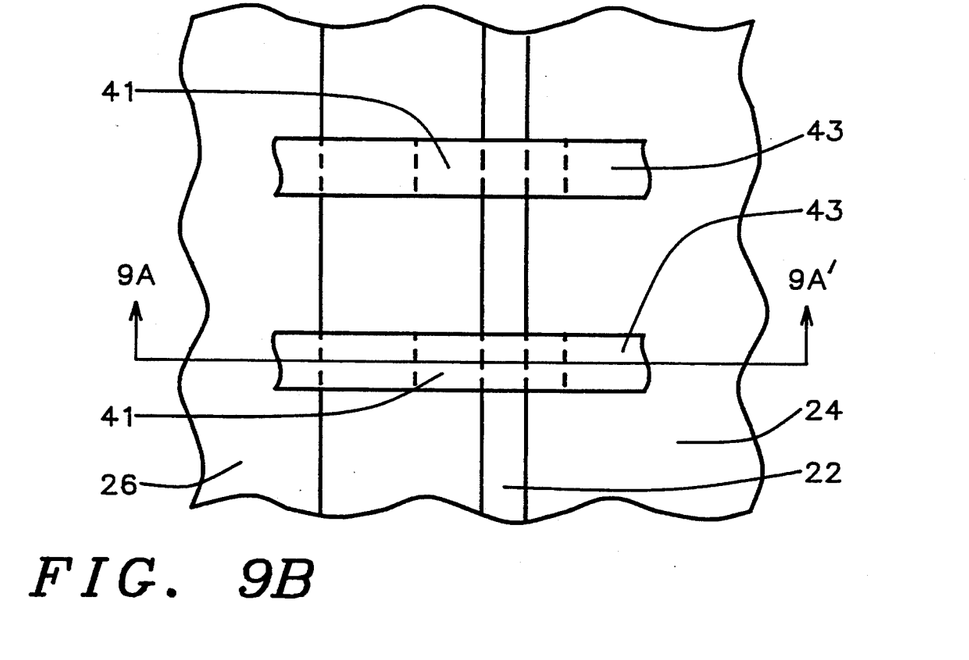
FIG. 9B is a top view of the split-gate EEPROM after the polysilicon control gate electrode has been formed.

Next, as shown in FIG. 9A, a polysilicon control gate electrode 43 is deposited and patterned using conventional means. FIG. 9B shows an example of the top view of the flash EEPROM memory at this stage of fabrication. As shown in FIG. 9B, the control gate electrodes 43 are at right angles to the source region 26, the drain region 24, and the light doped region 22.

Figure 10:
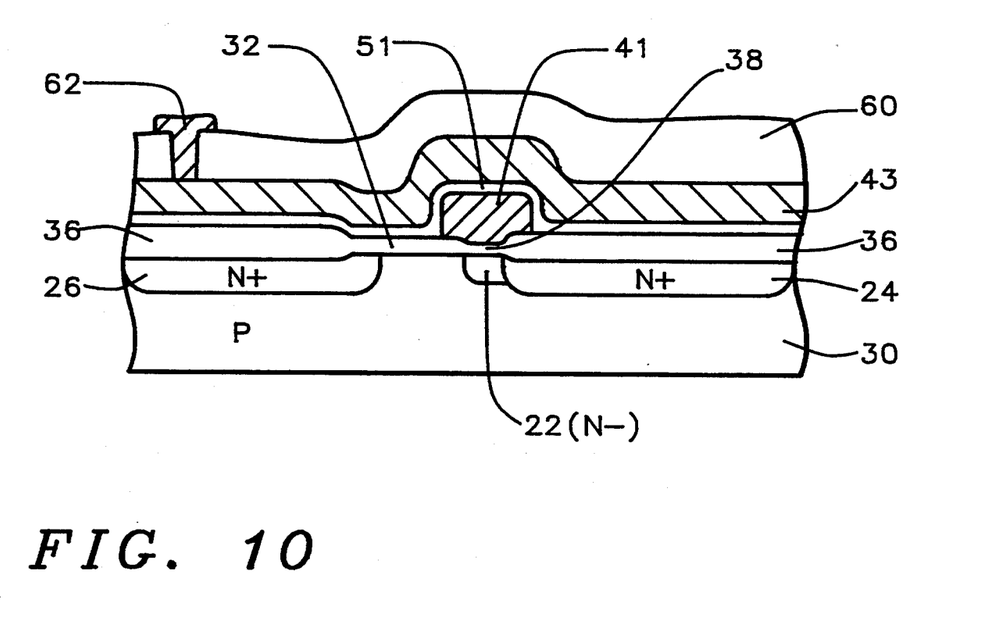
FIG. 10 is a cross section of the split-gate EEPROM after the insulating dielectric layer and metal contact to the floating gate electrode have been formed.

Next, as shown in FIG. 10, an insulating dielectric layer 60, such as borophosphosilicate glass, with contact openings is formed on the flash EEPROM memory using conventional means. Metal contacts 62 to the control gate electrodes 43 are formed in the contact openings using conventional means. Next a patterned metal conducting layer, not shown, is formed on the insulating dielectric layer 60 and the flash EEPROM memory is covered by a passivating dielectric layer, not shown, using conventional means. Examples of the conventional means referred to in this embodiment can be found is the book "VLSI PROCESS TECHNOLOGY" Second Edition, by S. M. Sze, published by McGraw-Hill Book Co., New York, N.Y., 1988, pages 221–228, 233–269, and 375–418.

Refer now to FIG. 6A, FIG. 6B, and FIG. 7, there is shown an embodiment of a normal gate flash EEPROM, or electrically erasable and programmable read only memory. FIG. 6A shows a cross section of the EEPROM cell. There is an N+ source region 26, an N+ drain region 24, and an N− low doped region 22 formed in a P type silicon substrate. A gate oxide region 32, such as $SiO_2$ with a thickness of between about 150 and 500 Angstroms; a tunnel oxide region 38, such as $SiO_2$ with a thickness of between about 60 and 100 Angstroms; and self-aligned thick oxide regions, such as $SiO_2$ with a thickness of between about 150 and 500 Angstroms; are formed on the surface of the silicon substrate. The tunnel oxide region 38 is formed over the light doped region 22, the gate oxide region 32 is formed over the region between the light doped region 22 and the source region 26 extending over the edge of the source region, and the self-aligned thick oxide regions 36 are formed over the drain region 24 and that part of the source region 26 not covered by the gate oxide region. A polysilicon floating gate electrode 40 is formed over the tunnel oxide region 38 and the gate oxide region 32 extending over the edges of the source 26 and drain 24 regions. The floating gate electrode is patterned such that the floating gate electrode of one flash EEPROM cell is separated from the floating gate electrode of other flash EEPROM cells. A blanket layer of oxide/nitride/oxide 50 with a thickness of between about 100 and 300 Angstroms is formed over the floating gate electrode 40 and those parts of the self-aligned thick oxide region 36 not covered by the floating gate electrode 40. A polysilicon control gate electrode 42, which is also the word line, is formed over the oxide nitric oxide layer.

FIG. 6B shows an example of the top view of the flash EEPROM memory. The control gate electrode 42, or word line, is at right angles to the source region 26, the drain region 24, and the light doped region 22. FIG. 7 shows a layer of insulating dielectric 60, such as borophosphosilicate glass, with contact openings is formed on the flash EEPROM memory. Metal contacts 62 to the control gate electrodes 42 are formed in the contact openings, a patterned metal conducting layer, not shown, is formed on the insulating dielectric layer 60, and the flash EEPROM memory is covered by a passivating dielectric layer, not shown.

When a potential of between about 10 and 15 volts is applied to the polysilicon control gate electrode 42 while grounding the drain 24 electrons are injected into the floating gate electrode 40 from the drain through the tunnel oxide 38 thereby programming the memory cell. When a potential of between about 6 and 12 volts is applied to the drain 24 while grounding the control gate electrode 42 electrons are injected into the drain 24 from the floating gate electrode 40 thereby erasing the memory cell. The small tunnel oxide area keeps the voltage required for the programming and erase operations of the memory cell small.

Refer now to FIG. 9A, FIG. 9B, and FIG. 10, there is shown an embodiment of a split-gate flash EEPROM, or electrically erasable and programmable read only memory. FIG. 9A shows a cross section of the EEPROM cell. There is an N+ source region 26, an N+ drain region 24, and an N− low doped region 22 formed in a P type silicon substrate. A gate oxide region 32, such as $SiO_2$ with a thickness of between about 150 and 500 Angstroms; a tunnel oxide region 38, such as $SiO_2$ with a thickness of between about 60 and 100 Angstroms; and self-aligned thick oxide regions, such as $SiO_2$ with a thickness of between about 150 and 500 Angstroms; are formed on the surface of the silicon substrate. The tunnel oxide region 38 is formed over the light doped region 22, the gate oxide region 32 is formed over the region between the light doped region 22 and the source region 26 extending over the edge of the source region, and the self-aligned thick oxide regions 36 are formed over the drain region 24 and that part of the source region 26 not covered by the gate oxide region. A polysilicon floating gate electrode 41 is formed over the tunnel oxide region 38 and a part of the gate oxide region 32 adjacent to the tunnel oxide region. The floating gate electrode extends over the edge of the self-aligned thick oxide region 36 formed over the drain region 24. The floating gate electrode does not cover that part of the gate oxide region 32 between the edge of the source region 26 and the light doped region 22. The floating gate electrode is patterned such that the floating gate electrode of one flash EEPROM cell is separated from the floating gate electrode of other flash EEPROM cells. A blanket layer of oxide/nitride/oxide 51 with a thickness of between about 100 and 300 Angstroms is formed over the floating gate electrode 41 and those parts of the gate oxide region 32 and self-aligned thick oxide regions 36 not covered by the floating gate electrode 41. A polysilicon control gate electrode 43, which is also the word line, is formed over the oxide/nitride/oxide layer.

FIG. 9B shows an example of the top view of the flash EEPROM memory. The control gate electrode 43, or word line, is at right angles to the source region 26, the drain region 24, and the light doped region 22. FIG. 10 shows a layer of insulating dielectric 60, such as borophosphosilicate glass, with contact openings is formed on the flash EEPROM memory. Metal contacts 62 to the control gate electrodes 43 are formed in the contact openings, a patterned metal conducting layer, not shown, is formed on the insulating dielectric layer 60, and the flash EEPROM memory is covered by a passivating dielectric layer, not shown.

When a potential of between about 10 and 15 volts is applied to the polysilicon control gate electrode 43 while grounding the drain 24 electrons are injected into the floating gate electrode 41 from the drain through the tunnel oxide 38 thereby programming the memory cell. When a potential of between about 6 and 12 volts is applied to the drain 24 while grounding the control gate electrode 43 electrons are injected into the drain 24 from the floating gate electrode 41 thereby erasing the memory cell. The small tunnel oxide area keeps the voltage required for the programming and erase operations of the memory cell small.

While the invention has been particularly shown and described with reference to the preferred embodiments thereof, it will be understood by those skilled in the art that various changes in form and details may be made without departing from the spirit and scope of the invention.

What is claimed is:

1. A method of forming a flash EEPROM device, comprising the steps of:
   providing a semiconductor substrate;
   forming a gate dielectric layer on said semiconductor substrate;
   forming a patterned nitride layer on said gate dielectric layer;
   forming a lightly doped region in said semiconductor substrate using a normally directed ion implant beam;
   forming a source region having an inner edge and a drain region having an inner edge in said semiconductor substrate using a large angle ion implant beam thereby forming a lightly doped area adjacent to said inner edge of said drain region;
   removing, by means of etching, that part of said gate dielectric layer not covered by said patterned nitride layer;
   forming a tunnel dielectric area directly over said lightly doped area;
   forming self-aligned dielectric areas directly over said source region and said drain region;
   removing, by means of etching, said patterned nitride layer;
   forming a floating gate electrode on said semiconductor substrate;
   forming a interlevel dielectric layer on said floating gate electrode and on that part of said self-aligned dielectric area not covered by said floating gate electrode;
   forming a control gate electrode on said interlevel dielectric layer;
   forming an insulating dielectric layer over said control gate electrode;
   forming contact openings in said insulating dielectric layer; and
   forming metal contacts in said contact openings in said insulating dielectric layer.

2. The method of claim 1 wherein said floating gate electrode extends over said inner edge of said source region, said lightly doped area, and said inner edge of said drain region.

3. The method of claim 1 wherein said floating gate electrode extends over said inner edge of said drain region and said lightly doped area.

4. The method of claim 1 wherein said semiconductor substrate is P conductivity type silicon.

5. The method of claim 1 wherein said normally directed ion implant beam is arsenic or phosphorus with between about $1 \times 10^{13}$ and $1 \times 10^{14}$ ions/cm$^2$ at an energy of between about 30 and 100 keV.

6. The method of claim 1 wherein said large angle ion implant beam is arsenic with between about $1 \times 10^{15}$ and $5 \times 10^{15}$ ions/cm$^2$ at between about 30 and 100 keV.

7. The method of claim 1 wherein the angle between said large angle implant beam and a line normal to the surface of said semiconductor substrate is between about 10° and 60°.

8. The method of claim 1 wherein said tunnel dielectric area is formed of SiO$_2$ with a thickness of between about 60 and 100 Angstroms.

9. The method of claim 1 wherein said tunnel dielectric area is formed of SiO$_2$ with a width across the substrate of between about 500 and 5000 Angstroms.

10. The method of claim 1 wherein said gate dielectric is formed of SiO$_2$ with a thickness of between about 150 and 500 Angstroms.

11. The method of claim 1 wherein said self-aligned dielectric is formed of SiO$_2$ with a thickness of between about 150 and 500 Angstroms.

12. The method of claim 1 wherein said floating gate electrode and said control gate electrode are formed of polysilicon.

13. The method of claim 1 wherein said interlevel dielectric layer is oxide/nitride/oxide with a thickness of between about 100 and 300 Angstroms.

* * * * *